United States Patent [19]

Morishita et al.

[11] Patent Number: 4,570,199
[45] Date of Patent: Feb. 11, 1986

[54] PROTECTION CIRCUIT FOR VOLTAGE REGULATOR OF VEHICLE MOUNTED GENERATOR

[75] Inventors: Mitsuharu Morishita; Shinichi Kouge; Shirou Iwatani; Katsuhiro Sasaki, all of Hyogo, Japan

[73] Assignee: Mitsubishi Denki Kabushiki Kaisha, Tokyo, Japan

[21] Appl. No.: 593,006

[22] Filed: Mar. 23, 1984

[30] Foreign Application Priority Data

Mar. 25, 1983 [JP] Japan ................... 58-50893
Apr. 5, 1983 [JP] Japan ................... 58-60596

[51] Int. Cl.$^4$ ........................... H02H 3/093
[52] U.S. Cl. ........................ 361/18; 322/28
[58] Field of Search ............... 361/18, 87, 93, 94, 361/98; 322/25, 28

[56] References Cited

U.S. PATENT DOCUMENTS 3,723,817  3/1973  Leonard et al. ............... 322/28 X
4,152,744  5/1979  Pang ........................... 361/98 X
4,360,773  11/1982 Voss ............................ 322/28
4,401,937  8/1983  Morishita ..................... 361/18 X
4,477,766  10/1984 Akita et al. ................... 322/28

FOREIGN PATENT DOCUMENTS

1186540  2/1965  Fed. Rep. of Germany ........ 361/18

Primary Examiner—Harry E. Moose, Jr.
Attorney, Agent, or Firm—Sughrue, Mion, Zinn, Macpeak & Seas

[57] ABSTRACT

An over current of an output transistor circuit of a voltage regulation of a vehicle mounted charging generator due to a short-circuit of a field winding thereof is detected and a capacitor is charged when the detected current is larger than a predetermined value. The voltage of the capacitor is compared with a reference voltage and the output transistor circuit is cut off during the voltage of the capacitor is larger than the reference voltage, whereby a breakdown of the output transistor circuit is prevented.

4 Claims, 12 Drawing Figures

PROTECTION CIRCUIT FOR VOLTAGE REGULATOR OF VEHICLE MOUNTED GENERATOR

BACKGROUND OF THE INVENTION

This invention relates to a control device of a vehicle mounted, charging generator driven by, for example, an internal combustion engine thereof for regulating an output voltage of the motor generator to a predetermined value and, particularly, to a protection circuit for use in such control device for protecting an output transistor of the control device when an excess current flows due to, for example, a short-circuit of a field winding of the generator.

Figure 1:
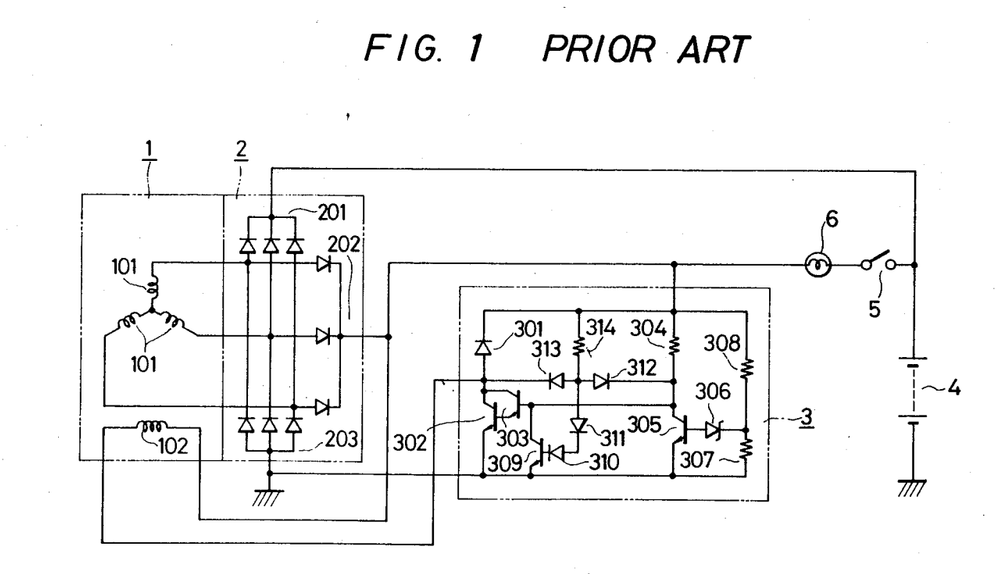
FIG. 1 is a circuit diagram showing an example of a conventional control device.

FIG. 1 shows an example of a conventional voltage regulator of a vehicle-mounted generator in which a three-phase a.c. generator 1 includes a three-phase star wired armature winding 101 and a field winding 102. A full wave rectifier 2 for rectifying an a.c. output of the generator 1 includes a first d.c. output terminal 201, a second d.c. output terminal 202 and a grounding terminal 203. voltage regulator 3 controls an output voltage of the generator 1 to a first predetermined value by controlling a field current flowing through the field winding 102 and includes a surge absorbing diode 301 connected across the field winding 102, output transistors 302 and 303 for on-off controlling the field current, a resistor 304 constituting base circuits of the transistors 302 and 303, a transistor 305 for on-off controlling the output transistors 302 and 303, a Zener diode 306 responsive to the output voltage of the generator 1 for turning-on when the output voltage becomes equal to or higher than the first predetermined voltage, resistors 307 and 308 connected in series with each other and constituting a voltage driver circuit for the output voltage of the generator 1, a limiting transistor 309 connected in parallel to the control transistor 305 for on-off controlling the transistors 302 and 303, level shift diodes 310 and 311 connected in series with a base terminal of the transistor 309, a first detection diode 312 for detecting a collector voltage of the control transistor 305, a second detection diode 313 for detecting a collector voltages of the output transistors 302 and 303, a base resistor 314 disposed in the base circuit of the limiting transistor 309, a battery 4, a key switch 5 and a charge indicator lamp 6.

In operation, when there is no short-circuit between phases of the field winding 102 and the key switch 5 is closed to input the engine, a base current flows from the battery 4 through the key switch 5, the charge indicator lamp 6 and the base resistor 304 of the output transistor 303 to turn the latter transistor on and thus the output transistor 302 is turned on. Upon the conduction of the transistor 302, a field current flows from the battery 4 through the key switch 5, the charge indicator lamp 6, the field winding 102 and the transistor 302 and thus a field magnetomotive force is generated. At this time, a collector-emitter voltage of the output transistor 302 is lower than a sum of a base-emitter voltage of the limiting transistor 309 and a forward voltage drop of the level shift diodes 310 and 311 and thus the transistor 309 is in an off state.

Then when the engine is started to drive generator 1 and an output voltage of the generator 1 exceeds the first predetermined value of the voltage regulator 3, the Zener diode 306 and the control transistor 305 are turned-on and the output transistors 302 and 303 are turned-off. Therefore, the output voltage of the generator 1 is lowered. Since, at this time, the control transistor 305 is conductive, a collector-emitter voltage of the latter becomes lower than a sum of the base-emitter voltage of the control transistor 309 and the forward voltage drop of the diodes 310 and 311 and thus the limiting transistor 309 is kept non-conductive.

When the output voltage of the generator is lowered to the first predetermined level, the output transistors 302 and 303 are turned on again to energize the field winding 102 to thereby increase the output voltage of the generator. The output voltage of the generator 1 can be regulated at the first predetermined level upon repetitions of the above mentioned operations.

On the other hand, if the field winding 102 is short-circuited or there is an inter-phase short-circuit, when the key switch 5 is closed while the engine is in the rest state, the collector current of the output transistor 302 is sharply increased. However, since the base current of the transistor 303 is limited by the resistor 304, amplification is not sufficient and the voltage between the collector and the emitter of the transistor 302 becomes equal to or above a sum of the base-emitter voltage of the limiting transistor 309 and the forward voltage drop of the diodes 310 and 311. Since the engine is in the rest state at this time and there is no output generated by the generator 1, the Zener diode 306 and the control transistor 305 are non-conductive. Therefore, a current flows through the resistor 314, the diodes 310 and 311 and the base-emitter of the limiting transistor 309 to turn the latter on. Thus, the output transistors 302 and 303 are cut off, so that a breakdown of the output transistor 302 and 303 due to very large collector currents can be prevented.

Figure 2:
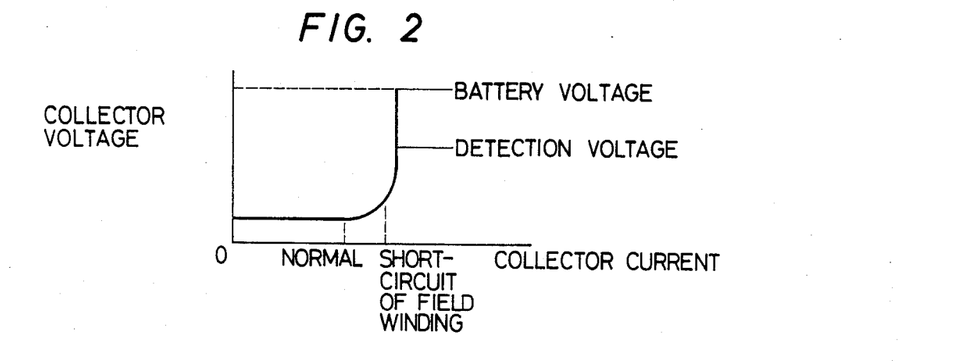
FIG. 2 is a waveform showing a collector currentcollector potential characteristics of output transistors of the control device.

In the conventional device shown in FIG. 1, the collector current of the output transistor 302 and hence the collector current of the output transistor 303 necessary to turn-on the limiting transistor 309 is usually set at a very large value compared with the collector current in the normal conducting state, as shown in FIG. 2. Therefore, there is no large increase of current in a case of inter-phase short-circuit of the field winding 102. Further, in a conventional system where the field current is supplied from an output terminal of a second rectifier, the output voltage of the generator 1 is lowered in a case of rare short-circuit. Therefore there is no large increase of the collector currents of the transistors 302 and 303 and the collector potential of the transistor 302 and 303 does not increase to a value at which the limiting transistor 309 is turned-on. Therefore, the transistors 302 and 303 may be broken.

Figure 3:
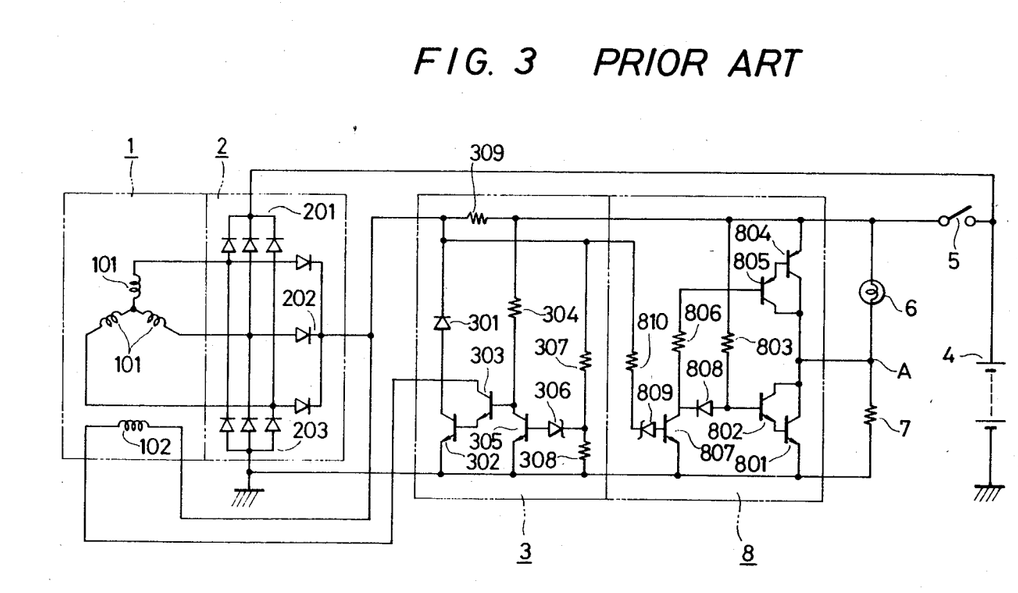
FIG. 3 is a circuit diagram showing another example of the conventional control device.

FIG. 3 shows another example of the conventional device which includes, in addition to a circuit construction which is similar functionally to that in FIG. 1, a drive switching circuit 8. The latter circuit 8 includes first drive Darlington transistor 801 and 802 for driving the charge indicating lamp 6, a resistor 803 constituting a base circuit of the first drive transistors second drive Darlington transistors 804 and 805 which are turned-on when the first drive transistors 801 and 802 feed a load 7, a resistor 806 limiting base currents of the second transistors 804 and 805, a switching transistor 807 which becomes conductive at the voltage between the first and second predetermined voltage showing the power generating condition, a resistor 803 for limiting a current flow to the resistor 806 during the time transistor 807 is in an off state, a Zener diode 809 connected to a base of the transistor 807 and adapted to be turned on when the voltage of the second rectifier output terminal 202 is equal to or larger than the second predetermined value and a resistor 810 for limiting a current flow through the Zener diode when the latter is in an on state.

The operation of the circuit constituted with the components 1, 2 and 3 of the device in FIG. 3 is similar to that of the circuit in FIG. 1 except that the circuit component 3 in FIG. 3 does not include the limiting transistor 309 and the other elements associated therewith. Therefore it may be unnecessary to explain an operation thereof and it may be enough to explain an operation of the drive switching circuit 8.

The voltage at the second rectifying output terminal 202 is below the second predetermined value during the starting stage of the generator 1. Therefore, the Zener diode 809 and the switching transistor 807 are in the off state. Thus, the second drive transistors 804 and 805 are in the off state. On the other hand, the first drive transistors 801 and 802 are supplied with base currents through the resistor 803 and are in the on-state, causing the charge indicator lamp 6 to be lit. Then, when the output voltage of the generator 1 is regulated to the first predetermined value, the Zener diode 809 and the switching transistor 807 become conductive and the first drive transistors 801 and 802 are turned-off. The second drive transistors 804 and 805 are supplied with base currents through the resistor 806 and thus turnedon. Therefore, the indicator lamp is extinguished and the load 7 is fed through the transistors 804 and 805.

However, when the load 7 is short-circuited while it is fed with a current through the transistors 804 and 805 with the output voltage of the generator 1 being regulated to the first predetermined value, a large current flows through the second drive transistors leading to the breakdown thereof.

SUMMARY OF THE INVENTION

An object of the present invention is to provide a protection circuit for use in connection to a control device of a generator driven by an internal combustion engine for protecting the control device when a field winding of the generator is short-circuited.

Another object of the present invention is to provide a protection circuit for use in connection with a control device of a generator of such type for protecting the control device when a load is short-circuited.

DETAILED DESCRIPTION OF THE PREFERRED EMBODIMENTS

Figure 4:
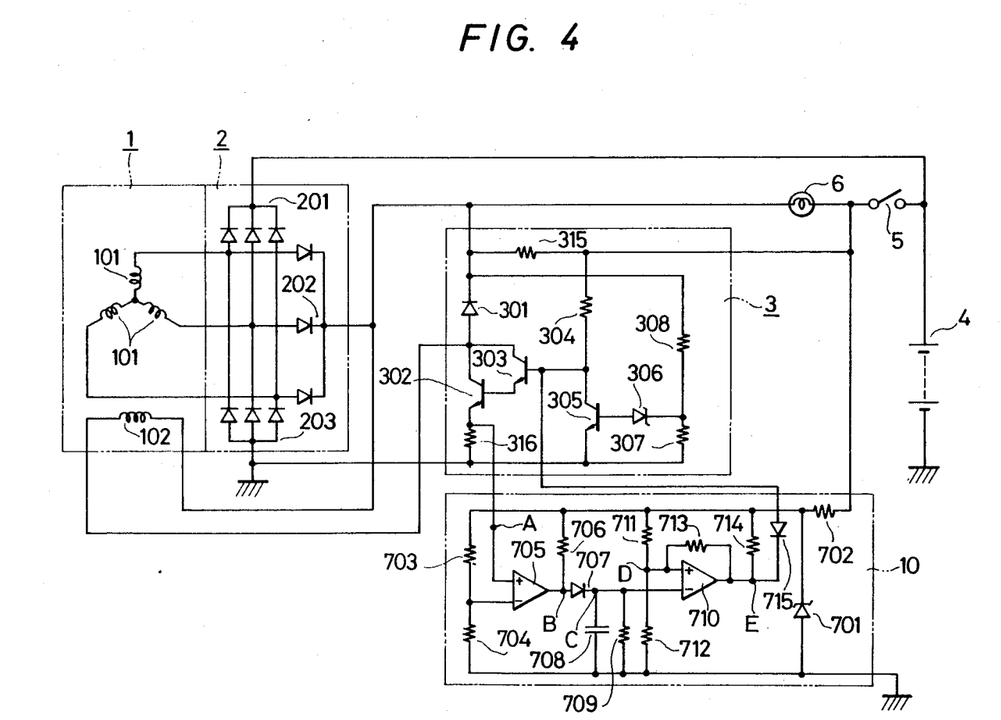
FIG. 4 is a circuit diagram showing an embodiment of the present invention.

In FIG. 4 which shows a protection circuit according to an embodiment of the present invention, the protection circuit 10 comprises a Zener diode 701 which constitutes a power source of the protection circuit 10. The latter further includes a resistor 702 for supplying a bias current to the Zener diode 701, series connected current limiting resistors 703 and 704 for limiting the current to the second predetermined value, a first comparator 705 for providing an output when a collector current of the output transistor 302 exceeds the second predetermined current, a resistor 706 connected to an output of the first comparator 705, a diode 707 for charging a capacitor 708 through the resistor 706 and holding the charged state thereof when the first comparator 705 has no output, the capacitor 708 being charged when the collector current of the transistor 302 is equal to or exceeds the second predetermined value, a resistor 709 for determining a discharge time constant of the capacitor 708, a second comparator 710 which provides an output during the time capacitor 708 discharges, resistors 711 to 714 constituting a hysterisis circuit for setting a reference voltage for the second comparator 710 to the charge voltage of the capacitor 708 and a diode 715 for cutting off the transistor 302 during the time second comparator 710 provides output.

Figure 5:
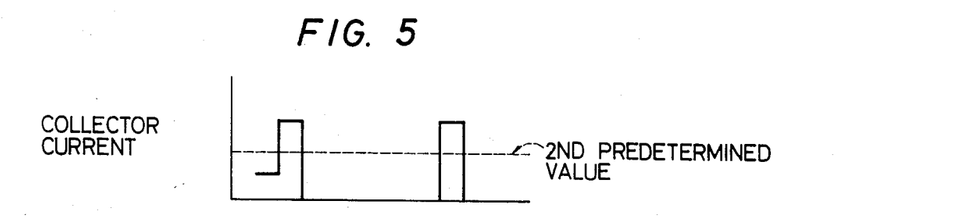
FIG. 5 is a waveform showing a detection current of a shunt resistor of the embodiment in FIG. 4.
Figure 6:
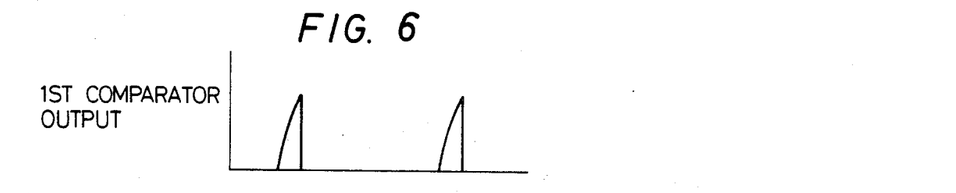
FIG. 6 is an output waveform of a first comparator in FIG. 4.
Figure 7:
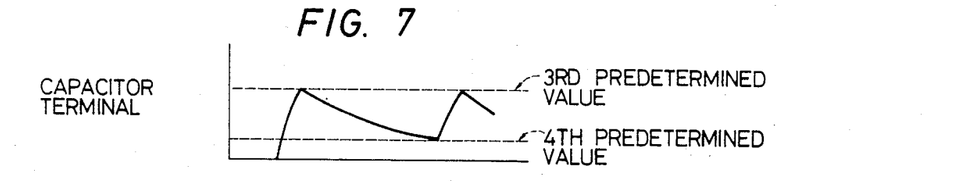
FIG. 7 is a voltage waveform at a capacitor in FIG. 4.

In operation, if an inter-phase short-circuit of the field winding 102 occurs during the time control transistor 305 is in the non-conductive state and the output transistors 302 and 303 are in the conductive state, an excess current flows through the output transistor 302 as shown in FIG. 5. When a voltage drop across the current detecting shunt resistor 316 exceeds the second predetermined value determined by the resistors 703 and 704, an output of the comparator 705 is provided as shown in FIG. 6. As a result, the capacitor 708 is immediately charged through the resistor 706 and the diode 707 as shown in FIG. 7.

Figure 8:
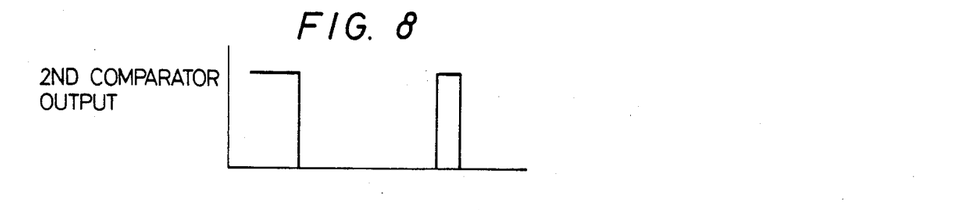
FIG. 8 is an output waveform of a second comparator in FIG. 4.

A voltage at a non-inverting input (+) of the second comparator 710 is usually at a third predetermined value which is determined by a ratio, in resistance, of the resistor 712 to a parallel circuit of the resistor 711 and the series connected resistors 713 and 714. Since the charge voltage of the capacitor 708 exceeds the third predetermined value, the second comparator 710 provides an output as shown in FIG. 8. The latter output is applied to transistors 302 and 303 through the diode 715, causing the transistors to be turned off as shown in FIG. 5. The first comparator 705 provides an output again as shown in FIG. 6. At this time, however, since the capacitor 708 is prevented by the diode 707 from discharging to the output terminal of the first comparator 705, it discharges gradually through the resistor 709 as shown in FIG. 7.

Since the second comparator 710 provides a low level output at this time, the voltage at the non-inverting input (+) of the second comparator 710 is at a fourth predetermined value which is lower than the third value determined by the resistors 711, 712 and 713. The second comparator 710 continues to provide the low level output until the voltage across the capacitor 708 is reduced below the fourth value. When the voltage of the capacitor 708 becomes lower than the fourth value, the second comparator stops to provide the low level output as shown in FIG. 8 and thus the output transistor 302 is turned on. When an excess current higher than the second value flows again, the above operation is repeated as shown in FIG. 5.

That is, when a large current above the second value flows through the output transistor 302 due to a short-circuit of the field winding 102, the output transistor 302 is on-off controlled repeatedly so that an average heat generation of the output transistor 302 is reduced and thus a breakdown of the voltage regulator 3 is prevented additionally.

Figure 9:
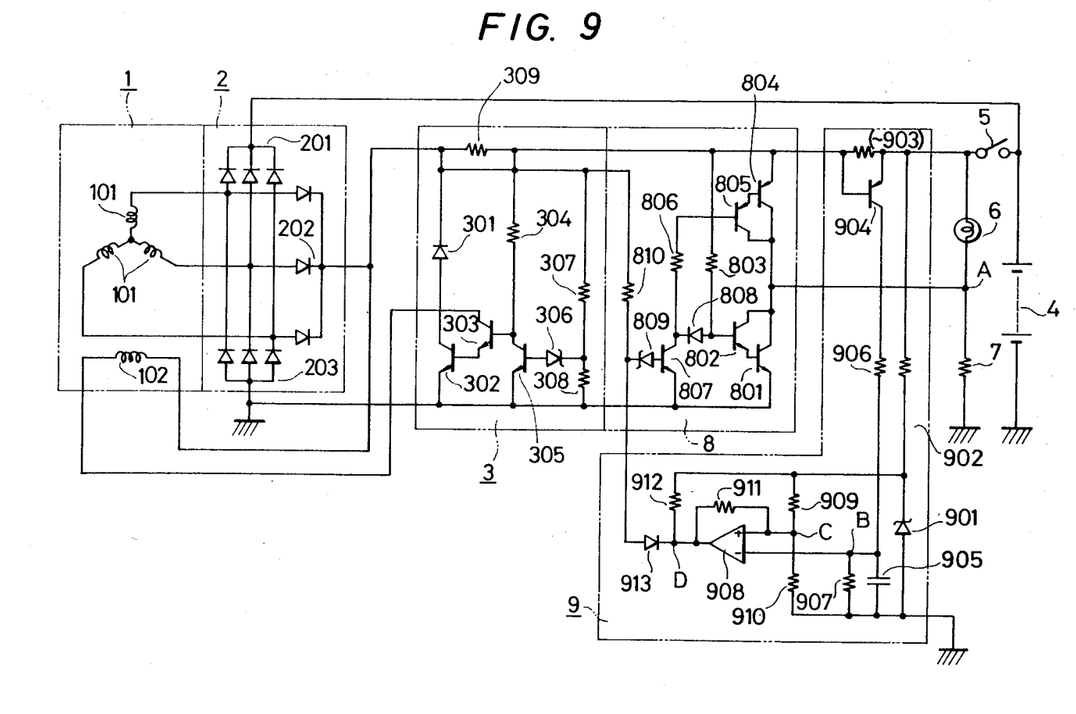
FIG. 9 is a circuit diagram of another embodiment of the present invention.

FIG. 9 shows another embodiment of the present invention which is applicable to the conventional device having a switching circuit shown in FIG. 3. In FIG. 9, a protection circuit 9 is composed of a Zener diode 901 which constitutes a power source of the circuit, a resistor 902 for supplying a bias current to the Zener diode 901, a current flowing through the key switch 5 and the drive switching circuit 8, a transistor 904 adapted to be driven when an excess current is detected, a resistor 906 for limiting a charging current for the capacitor 905, a discharge resistor 907 for the capacitor 905, a comparator 908 which provides an output when the excess current is detected, resistors 909 to 912 which constitute a hysterisis circuit and determines a reference voltage for the comparator 908 with respect to the charging voltage of the capacitor 908 and a diode 913 for turning off the switching transistor 807 when the comparator 908 provides an output.

Figure 10:
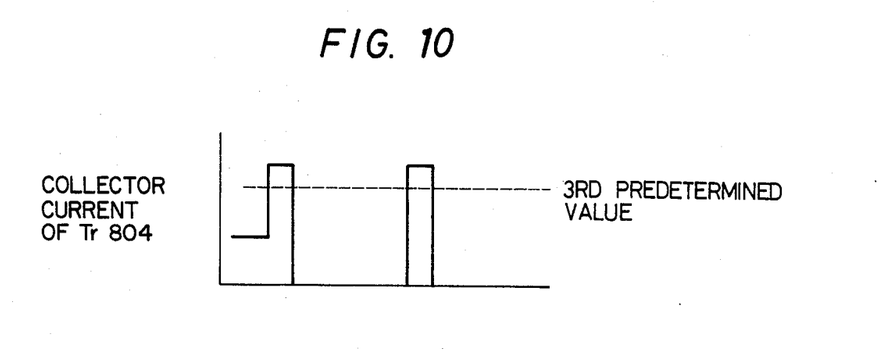
FIG. 10 is a voltage waveform at a point of the embodiment in FIG. 9.
Figure 11:
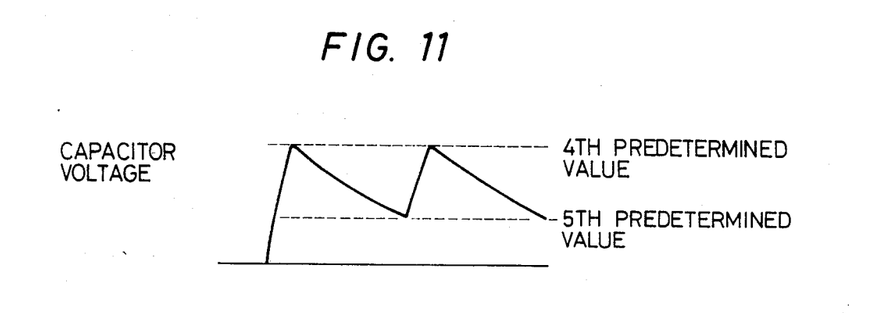
FIG. 11 is a voltage waveform across a capacitor shown in FIG. 9.
Figure 12:
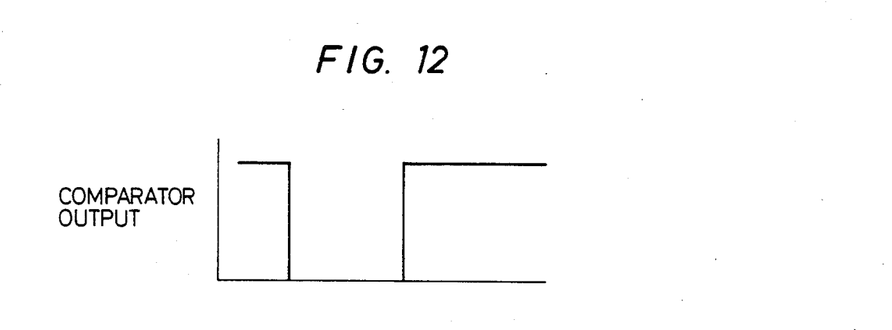
FIG. 12 is a voltage waveform of a comparator shown in FIG. 9.

In the protection circuit constituted above, when a junction between the charge indicator lamp 6 and the load resistor 7 is grounded directly or through the latter resistor while the output voltage of the generator 1 is regulated to the first predetermined value and the load resistor 7 is fed through the second drive transistor 804, a very large current flows through the transistor 804 as shown in FIG. 10. When the very large current becomes equal to or larger than the third value defining the excess current, a voltage across the shunt resistor 903 increases beyond the base-emitter voltage of the transistor 904 causing the latter to be turned-on. As a result, the capacitor 905 is charged through the transistor 904 and the resistor 906 as shown in FIG. 11. At this time, a voltage at a non-inverting input (+) of the comparator 908 is a fourth value determined by a ratio of the resistance of the resistor 910 to a resistance of a parallel connection of the resistor 909 and the series connected resistors 911 and 912 in a normal state. When the charge voltage of the capacitor 905 increases beyond the fourth value, the comparator 908 provides a low value output as shown in FIG. 12 and the switching transistor 807 is turned off through the diode 913. Upon the turning-off of the transistor 807, the second drive transistor 804 is turned-off. As a result, the voltage across the shunt resistor 903 becomes zero and so the transistor 904 is turned off. Therefore, the capacitor 905 discharges gradually through the resistor 907 as shown in FIG. 11. At this time, the voltage at the non-inverting input (+) of the comparator 908 is at a fifth value which is lower than the fourth value and is determined by a ratio of the resistor to the series resistors 910 and 911. Therefore, the comparator 908 continues to provide the output until the voltage of the capacitor 905 reduces below the fifth value. When the capacitor voltage reduces below the fifth value, the comparator 908 terminates to provide the output as shown in FIG. 12 and the second transistor 804 is turned-on again. When an excess current larger than the third value flows through the transistor 804 again as shown in FIG. 10, the above mentioned operation is repeated.

According to the present invention, an excess current larger than a predetermined value flows through a power transistor, the conduction of the latter transistor is controlled intermittently, so that a breakdown thereof is prevented effectively.

We claim:

1. A protection circuit for protecting an output transistor circuit of a semiconductor control device of a vehicle mounted charging generator against an over current flowing through the output transistor circuit due to a short-circuit, which includes a voltage regulator for regulating an output voltage of said generator to a predetermined value by controlling a current flowing through a field winding of said generator, comprising, a first constant voltage source,
   a first detecting means for detecting a current of an output transistor circuit of said semiconductor control device and providing an output when the current becomes equal to or larger than a normal current of said output transistor circuit,
   a first capacitor means responsive to the output of said first detecting means to be charged only when the output of said first detecting means exists and discharged when the output of said first detecting means terminates,
   a first comparator having a reference input supplied with a first constant voltage derived from said first constant voltage source and a comparison input connected to said first capacitor means and adapted to provide a control level output when the voltage of such first capacitor means equals or rises higher than said first constant voltage, and
   a first diode means connected between an output terminal of said first-comparator and said output transistor circuit to bias said output transistor circuit such that the latter is made non-conductive when said first comparator provides said control output.

2. The protection circuit as claimed in claim 1, wherein said first comparator has a hysterisis characteristics.

3. The protection circuit as claimed in claim 2, wherein said detecting means includes a shunt resistor connected in series with an output transistor of said output transistor circuit, a second comparator having a reference input supplied with a constant voltage derived from said constant voltage source and a comparison input connected to said shunt resistor, a diode connected between an output of said second comparator and said capacitor means and a resistor connected between said output of said second comparator and said constant voltage source.

4. A protection circuit for protecting a drive switching circuit for selectively feeding a load of a semiconductor control device of a vehicle mounted charging generator against an over current flowing through said drive switching circuit, said drive switching circuit having an output transistor circuit, said protection circuit comprising, a constant voltage source, a detecting means for detecting a current of said output transistor circuit of said drive switching circuit and providing an output when the latter current becomes equal to or larger than a normal current of said output transistor circuit of said drive switching circuit, a capacitor means responsive to the output of said detecting means to be charged only when the output of said detecting means exists and to be discharged when the output of said detecting means terminates,     a comparator having a hysterisis characteristic, said comparator having reference input supplied with a constant voltage derived from said constant voltage source and a comparison input connected to said capacitor means and adapted to provide a control output only when the voltage of said capacitor means is equal to or higher than said constant voltage, and a diode means connected between an output terminal of said comparator and said output transistor circuit of said drive switching circuit to bias the latter circuit such that the latter is made non-conductive during the period when said comparator provides an output.

* * * * *